United States Patent [19]

Lockhart, Jr.

[11] 3,880,493

[45] Apr. 29, 1975

[54] CAPACITOR SOCKET FOR A DUAL-IN-LINE PACKAGE

[75] Inventor: James Albert Lockhart, Jr., Basking Ridge, N.J.

[73] Assignee: Burroughs Corporation, Detroit, Mich.

[22] Filed: Dec. 28, 1973

[21] Appl. No.: 429,075

[52] U.S. Cl. .......................... 339/147 R; 339/17 CF
[51] Int. Cl. .............................................. H05k 1/18
[58] Field of Search ........... 339/126 R, 147, 151 M, 339/176 MP, 145 R, 278 A, 278 M, 275 A, 17 CF; 317/256, 257, 261

[56] References Cited

UNITED STATES PATENTS

| | | | |
|---|---|---|---|
| 2,748,328 | 5/1956 | Font et al. | 317/257 |
| 3,195,027 | 7/1965 | Vandermark et al. | 317/261 X |
| 3,721,941 | 3/1973 | Wisser | 339/126 R X |

*Primary Examiner*—Roy Lake
*Assistant Examiner*—E. F. Desmond
*Attorney, Agent, or Firm*—Alan Petlin Klein; William B. Penn; Kevin R. Peterson

[57] ABSTRACT

A socket for interconnecting a dual-in-line integrated circuit package and a printed circuit board assembly. The electrodes of a decoupling capacitor are embedded in the body of the socket, the material of the socket forming the dielectric of the capacitor, and the contacts of the capacitor making electrical contact with the socket connectors, which in turn have electrical contact with the dual-in-line package and the printed circuit board when the components are assembled.

5 Claims, 2 Drawing Figures

CAPACITOR SOCKET FOR A DUAL-IN-LINE PACKAGE

BACKGROUND OF THE INVENTION

This invention relates to a decoupling capacitor for employment in microelectronic circuits and more particularly to a socket of the dual-in-line type having a capacitive component for decoupling, from the microelectronic circuit in the socket, high frequency interference arising from the assembled circuit.

A dual-in-line package (DIP) is one in which an integrated circuit wafer is encapsulated in a body that is generally parallelopiped in shape, with dimensions of approximately ⅛ × ¼ × ¾ inch, and generally has either 14, 16 or 18 leads on 0.100 inch centers arranged in two parallel rows at opposite longitudinal sides of the body of the package. These leads, where they exit from the body of the package, are generally rectangular about 0.060 × 0.012 inch; and a short distance from the body the leads are reduced in size to about 0.022 × 0.012 inch.

Consequently the dual-in-line package permits the tiny, difficult to handle, integrated circuit wafer contained therein to be handled easily, and provides leads connected to the encapsulated wafer which are strong enough to permit the package to be mounted directly into a socket for interconnections, for example, with a printed circuit board. These sockets generally include a plastic or ceramic housing having rows of receiving holes containing socket terminals which are in alignment with the leads on the device to be connected. The sockets are constructed much like conventional octal pin sockets for mounting vacuum tubes. The space between the rows is often left open to conserve molding material.

Dual-in-line packages have found wide use as a means of providing a mounting and interconnection for a variety of integrated circuits. The encapsulated circuit may be, for example, a basic unit such as an operational amplifier, free running multivibrator, digital logic circuit, etc.

In microelectronic circuits employing a plurality of these modular integrated circuits, severe noise transients can arise in the power supply circuit due to the very fast switching times of some modular circuits. One method of preventing the coupling of this undesired high frequency interference into the rest of the circuit is to use low pass filters between the common power supply and the leads attached to the DIP's.

Heretofore, the decoupling capacitors have been assembled on the printed circuit board and then connected by printed circuit runs to the DIP leads corresponding to the power supply connection and ground pins. This procedure has several disadvantages: it is wasteful of space since the discrete capacitive components must be spread out around the printed circuit board; and the inductance of the lengthy printed circuit runs can nullify the effect of the capacitor in the circuit.

It is, therefore, one object of the present invention to provide a combination of an integrated circuit package and a dual-in-line socket for connecting the package to a printed circuit board, together with a decoupling capacitor attached thereto, the combination occupying a smaller area on the printed circuit board when mounted thereon than before.

It is another object to reduce the lead length of the decoupling capacitor required to be attached to a dual-in-line package, so as to maximize the decoupling efficiency, when the DIP is interconnected with a printed circuit board assembly.

SHORT STATEMENT OF THE INVENTION

These objects and the purposes of the invention are achieved by embedding the electrodes of a capacitor in the dielectric material of a socket for interconnecting a dual-in-line package with a printed circuit board, the material of the socket forming the dielectric of the capacitor and the contacts of the capacitor being electrically interconnected with the socket terminals for assembling the dual-in-line package with the circuit board.

The various objects, advantages and features of this invention will become more fully apparent from the following description, appended claims, and accompanying drawings, in which:

FIG. 1 is an exploded perspective view of a socket according to the invention, in assembly with a representative dual-in-line integrated circuit package and a printed circuit board of the types with which the invention may be used; and FIG. 2 is a sectional view of the socket of the invention taken along line 2—2 of the assembly of FIG. 1, with the elements of FIG. 1 in assembled relationship.

DESCRIPTION OF THE PREFERRED EMBODIMENT

Figure 2:
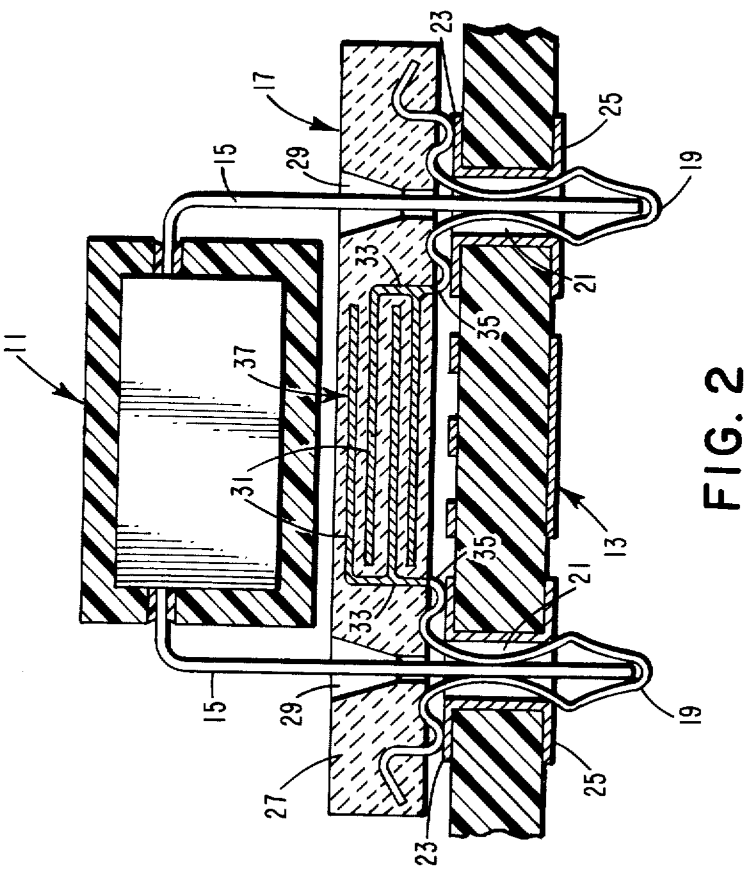
Figure 1:
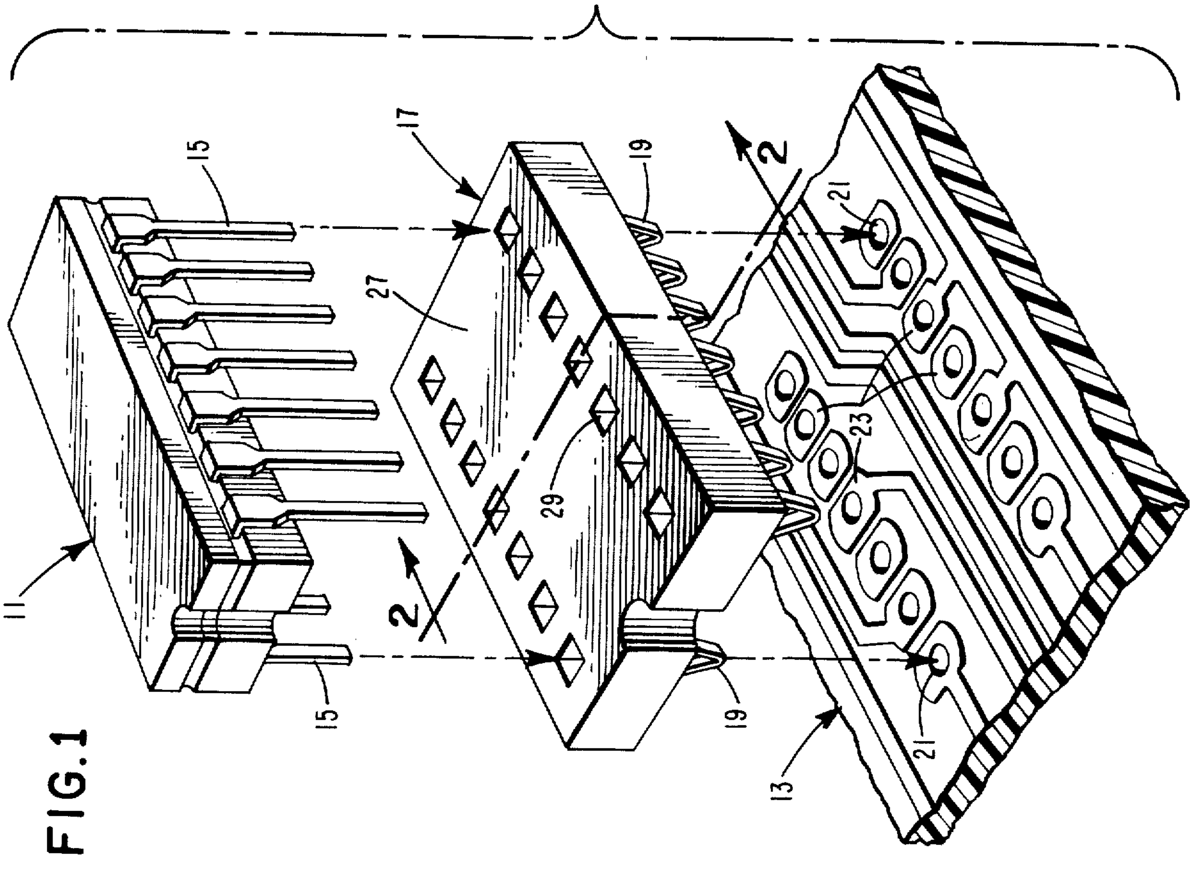

FIG. 1 illustrates an assembly in which electronic integrated circuit packages, such as the small rectangular unit 11, are mounted to a printed circuit board 13. The pins 15 of the integrated circuit package are fitted into receptacles in an intermediate socket 17 having electrical terminals in the form of terminal posts 19 extending from the socket underside. With the socket in place, the posts 19 lie partly within the uniformly spaced holes 21 in the printed circuit board and communicate electrically with upper metallic pads 23 and lower metallic pads 25 (FIG. 2) of the board.

The socket 17 which is the subject of the invention will now be described in detail. The socket 17 is primarily for use with an integrated circuit package of the dual-in-line type in which the terminal connections are evenly spaced in two parallel rows.

The housing 27 of the socket 17 is fabricated of any suitable dielectric known in the art such as plastic or ceramic, having good mechanical strength, and includes a parallel series of spaced, small apertures 29 along a pair of opposite sides for receiving the terminal pins 15 of the dual-in-line package 11.

The apertures 29, which are illustrated as having a square cross section but may be of any convenient shape, are normally tapered inwardly for guiding the terminal pins 15 into the terminal posts 19 of the socket 17. The terminal posts 19 of the socket 17 may be of any well-known dual function type for receiving the terminal pins 15 and for insertion into apertures of the printed circuit board 13 to make an electrically interconnected assembly.

The printed circuit board 13, as illustrated, has plated through holes 21, as well-known in the art, and leads 23, 25 on the upper and lower surfaces of the board. The terminal posts 19, therefore, may be of the resilient loop type, for example as shown, wherein the terminal pins 15 of the DIL make electrical contact with the inner surfaces of the loop and the outer surfaces of the loop make contact with the pads 23, 25 and/or the plated through holes 21 of the board. Another well-known type of terminal post is conical in shape (not shown) having forced frictional inner and outer connections with the pins 15 and the plated through holes 21, respectively.

The capacitor of the invention is encapsulated in the housing 27 of the socket 17. Preferably the electrodes 31 of the capacitor are interleaved parallel to the upper and lower surfaces of the block-like housing 27 and generally perpendicular to the planes of the pins 15 of the DIL when the components 11, 13 and 17 are assembled.

Alternate electrodes 31 of the capacitor 37 are electrically connected by means of conductive material 33. To the capacitor 37 formed thereby, are affixed a pair of leads 35, the ends interconnecting the terminal posts corresponding to the power supply connection and ground of the dual-in-line package with respect to the printed circuit. Thus, when the integrated circuit package 11 is mounted in socket 27, capacitor 37 is automatically electrically interconnected with the package and the printed circuit board assembly across the power supply and ground.

The specific details of the manner of otherwise constructing the socket with the capacitor encapsulated or potted therein form no part of the invention itself are within the level of ordinary skill in the art.

By way of example, the socket may be made from a pre-molded casing or pre-form including a cavity between the parallel rows of DIP pin receiving holes. The capacitor may be inserted within the cavity and connected to portions of terminal wires which extend into the cavity. Fluid or semi-fluid dielectric potting material, preferably the same as that of the pre-form, is then disposed over the capacitor, the connections, and the terminal wire portions, and subsequently allowed to harden about the capacitor as well-known in the potting art so as to form a coalescence with it which will completely encase the capacitor inside the socket.

Since it is obvious that many changes and modifications can be made in the above-described details without departing from the nature and spirit of the invention it is to be understood that the invention is not limited to said details except as set forth in the appended claims.

What is claimed is:

1. In a socket formed of dielectric material having terminals for receiving the pins of a microelectronic integrated circuit component and for insertion into a circuit in assembled relationship, said circuit having the characteristics of producing transient interference, means for decoupling from said microelectronic integrated circuit component transient interference arising from said circuit when said microelectronic integrated circuit component is connected thereto, said decoupling means being encapsulated in said socket; and leads affixed to said decoupling means, said decoupling means being interconnected between said terminals by said leads.

2. The combination as recited in claim 1 wherein potting material is inserted in said socket to encapsulate said decoupling means.

3. In a socket formed of dielectric material having terminals for receiving the pins of a microelectronic component and for insertion into a circuit in assembled relationship, said circuit having the characteristics of producing transient interference, means for decoupling from said microelectronic component transient interference arising from said circuit when said microelectronic component is connected thereto, wherein said decoupling means is a capacitor encapsulated in said socket; and leads affixed to said capacitor, said capacitor being interconnected to the terminals of said socket by said leads.

4. The combination as recited in claim 3 wherein the material of said socket forms the dielectric of said capacitor.

5. In a socket having a main body of dielectric material and terminals for receiving the pins of a dual-in-line integrated circuit package and for insertion into a printed circuit board in assembled relationship, one of said terminals being assigned to a power supply connection and another of said terminals being assigned to a ground connection, a capacitor encapsulated in said socket, the material of said socket forming the dielectric of said capacitor; and leads affixed to said capacitor, said capacitor being interconnected between said power supply terminal and said ground terminals by said leads.

* * * * *